United States Patent
Tsai et al.

(10) Patent No.: US 9,270,262 B2
(45) Date of Patent: Feb. 23, 2016

(54) POWER MANAGEMENT DURING WAKEUP

(71) Applicant: TAIWAN SEMICONDUCTOR MANUFACTURING COMPANY, LTD., Hsinchu (TW)

(72) Inventors: Tsung-Yen Tsai, Kanata (CA); Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/157,557

(22) Filed: Jan. 17, 2014

(65) Prior Publication Data

US 2014/0354346 A1   Dec. 4, 2014

Related U.S. Application Data

(60) Provisional application No. 61/829,752, filed on May 31, 2013.

(51) Int. Cl.
 *H04B 1/10* (2006.01)
 *H03K 17/081* (2006.01)
 *H03K 17/22* (2006.01)

(52) U.S. Cl.
 CPC ........ *H03K 17/08104* (2013.01); *H03K 17/223* (2013.01)

(58) Field of Classification Search
 CPC ........... H03K 5/1252; H04B 2215/064; H04B 2215/067; H04B 1/10
 See application file for complete search history.

(56) References Cited

U.S. PATENT DOCUMENTS

| | | | | |
|---|---|---|---|---|
| 5,859,552 A * | 1/1999 | Do et al. | | 327/170 |
| 6,026,042 A * | 2/2000 | Shirley et al. | | 365/210.12 |
| 8,331,188 B2 * | 12/2012 | Nakaoka | | 365/226 |
| 8,704,584 B2 * | 4/2014 | Shimazaki et al. | | 327/395 |
| 8,786,309 B2 * | 7/2014 | Takayanagi et al. | | 326/33 |
| 2007/0146024 A1 * | 6/2007 | Allan | | 327/156 |

* cited by examiner

*Primary Examiner* — Hai L Nguyen
(74) *Attorney, Agent, or Firm* — Hauptman Ham, LLP (57) ABSTRACT

A circuit includes a first set of transistors and a second set of transistors. The first set of transistors is configured to be turned on in a sequential manner. The second set of transistors is configured to be turned on in a sequential manner after the first set of transistors is turned on. A transistor of the first set of transistors corresponds to a first time delay. The first set of transistors corresponds to a second time delay that is a multiple of the first time delay.

20 Claims, 8 Drawing Sheets

POWER MANAGEMENT DURING WAKEUP

FIELD

The present disclosure is related to power management during wakeup of a circuit.

BACKGROUND

In some approaches, when a circuit is powered up, many transistors are turned on at a same time. Powering up the circuit is also called waking up the circuit because the circuit is woken up for operation, from a sleep mode, for example. When many transistors are turned on during waking up, a large amount of current flows through corresponding power nodes used by the transistors and results in a current spike called a wakeup peak current.

Reducing the wakeup peak current of a circuit to be within a design specification increases a wakeup time of the circuit. For example, in an approach, a wakeup circuit includes a series of wakeup stages. Each wakeup stage includes a PMOS switch connected in a chain manner. A wakeup signal is sequentially fed to each PMOS switch to turn on the chained PMOS switches one by one in a sequential manner. By turning on each PMOS switch in a sequential manner, the wakeup peak current is reduced. In such a condition, the wakeup time increases, however. Logic gates are also used in the wakeup circuit and result in increased circuit areas.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, two banks of transistors are used. Transistors in a first transistor bank are smaller than transistors in a second transistor bank. The first transistor bank and the second transistor bank operate to reduce a wakeup peak current, without incurring a delay penalty of a sequential wakeup. The second transistor bank includes transistors that are sized for normal operation of the circuit and that are sized independently of the wakeup peak current limitation specified for the circuit. As a result, sizing the transistors in the second transistor bank is easier. In some embodiments, an RC delay of the first transistor bank is used to delay turning on transistors in the second transistor bank to meet the wakeup peak current limitation. In some embodiments, the RC delay tracks the word size of an SRAM macro. Compared with another approach that uses a daisy chain wakeup, some embodiments of the present disclosure use less transistors in the wakeup circuit.

Circuits

Figure 1:
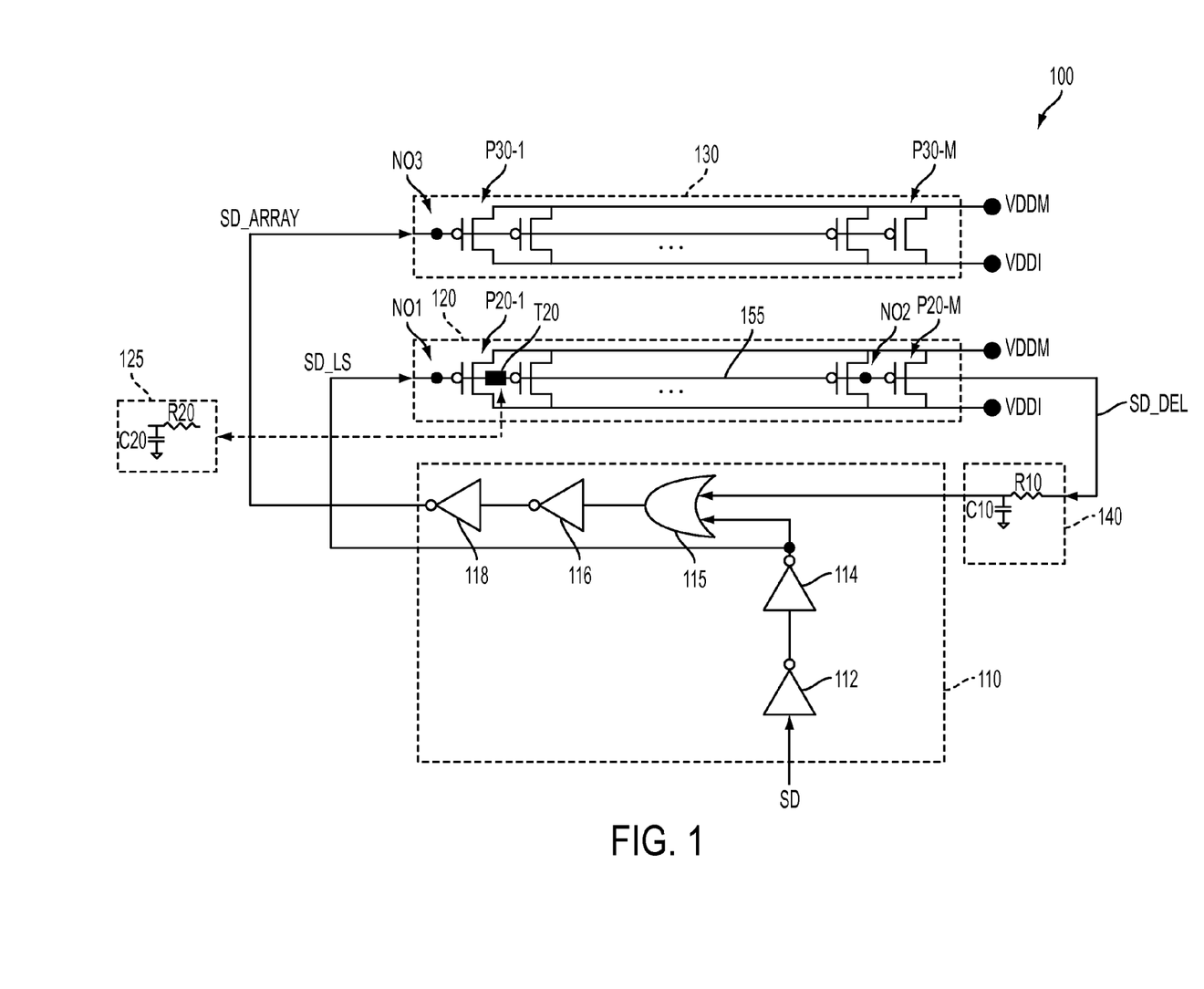
FIG. 1 is a diagram of a wakeup power-management circuit, in accordance with some embodiments.

FIG. 1 is a diagram of a circuit 100, in accordance with some embodiments. Circuit 100 is a wakeup power-management circuit. For example, during a wakeup mode, a peak current of circuit 100 is designed to be below a predetermined value specified as a maximum wakeup peak current. After the wakeup mode, circuit 100 provides a supply voltage VDD (not labeled) on a line VDDM to a line VDDI. In some embodiments in which circuit 100 is used to provide supply voltage VDD on line VDDI to circuits in a memory macro, the maximum wakeup peak current of circuit 100 is determined based on the peak current when the memory macro is under a read or a write operation. For example, the maximum wakeup peak current of circuit 100 is specified to be equal to the maximum peak current when the memory macro is under a read or a write operation.

Circuit or a transistor bank 120 includes a plurality of PMOS transistors P20, labeled as transistors P20-1 to P20-M where M is an integer number. A line 155 couples gates of transistors P20-1 to P20-M and includes nodes NO1 and NO2. Node NO1 represents a point on line 155 at a gate of the first transistor P20-1 in the chain of transistors P20-1 to P20-M. Node NO2 represents a point on line 155 at a gate of the last transistor P20-M in the chain of transistors P20-1 to P20-M.

Sources of PMOS transistors P20-1 to P20-M are coupled together and receive a supply voltage VDD (not labeled) on line VDDM. Drains of PMOS transistors P20 are coupled together and provide supply voltage VDD from line VDDM to line VDDI. Gates of transistors P20-1 to P20-M are coupled together by line 155, and receive a signal SD_LS. When signal SD_LS is logically low, transistors P20-1 to P20-M are turned on. As a result, supply voltage VDD at sources of transistors P20-1 to P20-M is transferred to drains of corresponding transistors P20-1 to P20-M. Effectively, supply voltage VDD on line VDDM is transferred to line VDDI. In some embodiments, in a wakeup mode, transistors P20-1 to P20-M in circuit 120 are turned on before transistors P30-1 to P30-M in circuit 130 are turned on. Explained in a different way, circuit 120 is turned on before circuit 130 is turned on. In some embodiments, a wakeup mode starts when signal SD at an input of an inverter 112 is activated with a transition from a high to a low logical value. The wakeup mode ends when a voltage on line VDDI is at a predetermined value with reference to a value of supply voltage VDD on line VDDM, and is ready for use by other circuits that use circuit 100. For example, the voltage on line VDDI is about 90%, 95%, 99%, etc., of supply voltage VDD. Other values of the voltage on line VDDI to be considered as an end of the wakeup mode are within the contemplated scope of the present disclosure. In some embodiments, after transistor P30-M in circuit 130 is turned on, the wakeup mode has ended.

Figure 8:
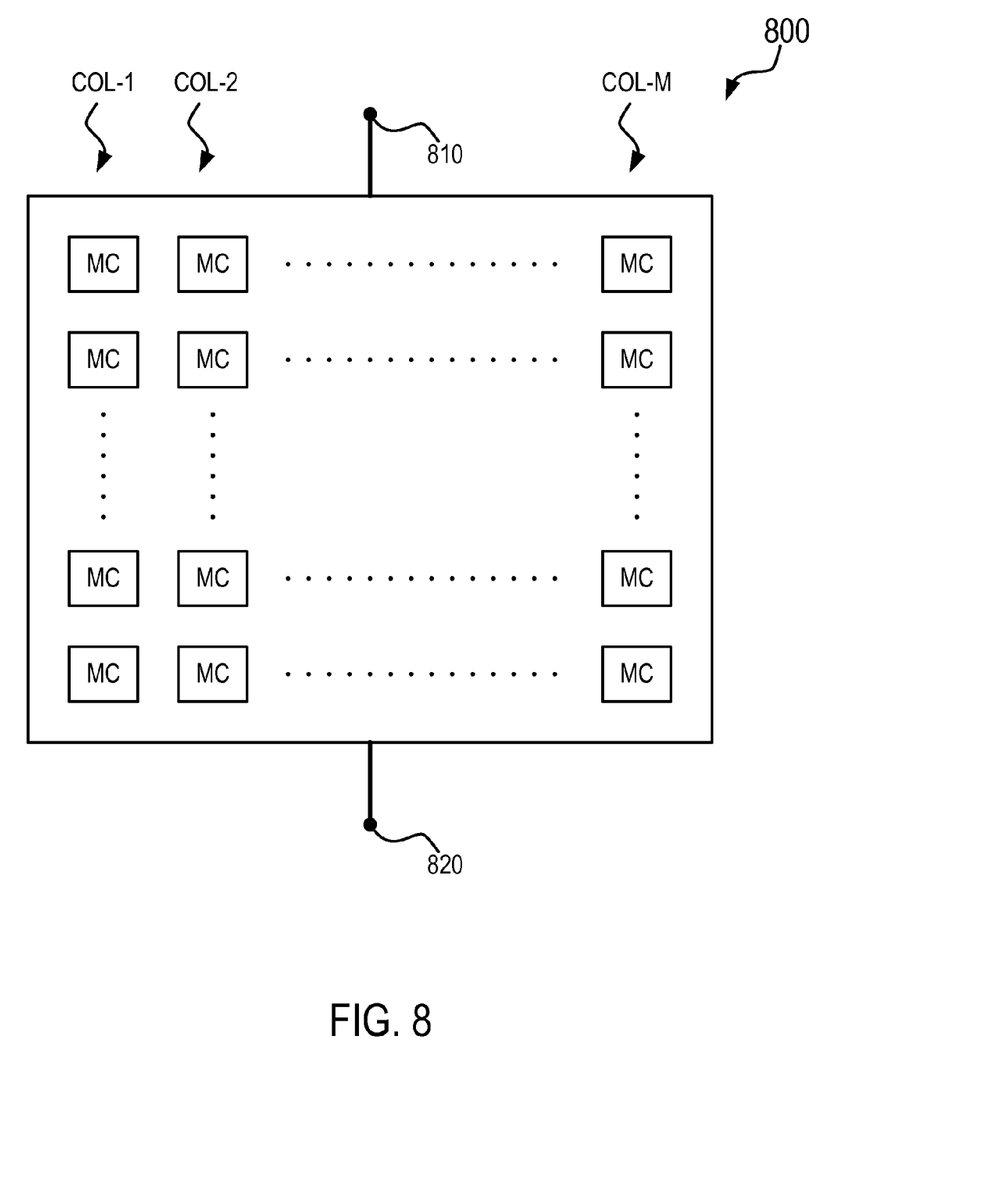
FIG. 8 is a diagram of a memory macro usable in conjunction with the circuit depicted in FIG. 1, FIG. 4, or FIG. 7 in accordance with some embodiments.

FIG. 8 is a diagram of a memory macro 800 usable in conjunction with the circuit 100 depicted in FIG. 1 in accordance with some embodiments. Memory macro 800 includes a plurality of memory cells MC arranged as an array with multiple rows and columns, such as columns COL-1, COL-2, and COL-M. Some details of memory macro 800 are not depicted in FIG. 8. Memory macro 800 is configured to receive a supply voltage from node 810 and a reference voltage from node 820. In some embodiments, node 810 is coupled with line VDDI in FIG. 1, and node 820 is coupled with a reference voltage VSS or ground.

In some embodiments, each of transistors P20-1 to P20-M corresponds to a local input-output (LIO) or a column COL-1, COL-2, or COL-M of a memory array of a memory macro 800. Further, each of transistors P20-1 to P20-M is sized such that, during a wakeup mode, the peak current of circuit 100 is less than a predetermined current specified as the maximum wakeup peak current for the memory macro.

In some embodiments, a portion or a line segment of line 155 between a gate of a first transistor P20 and a gate of a second transistor P20 in the chain of transistors P20-1 to P20-M corresponds to a time delay T20. For illustration, a circuit 125 representing one time delay T20 between the gates of transistors P20-1 and P20-2 on line 155 is shown. Effectively, each of transistors P20-1 to P20-M corresponds to a time delay T20. In some embodiments, time delay T20 corresponds to a resistor-capacitor (RC) constant of a resistor R20 and a capacitor C20 that represent the corresponding effective resistance value and effective capacitance value of the line segment between two gates of two transistors P20. Because the portion of line 155 between node NO1 and node NO2 corresponds to M transistors P20, from transistor P20-1 to transistor P20-M, the portion of line 155 between node NO1 and node NO2 has a time delay M*T20, which, for illustration, is called time delay T55 (not labeled). In some embodiments, time delay T55 is related to the number of columns in a memory array of a memory macro by a ratio RAT (not labeled), in which RAT is a mathematical real number. For example, when M is the number of columns of the memory array, time delay T55 is proportional to RAT*M. Symbolically expressed,

T55αRAT*M

For example,

T55 α (0.25*M) or (0.5*M) or (1*M) or (2*M) or (3*M), etc.

Time delay T55 varies also based on a length of the portion of line 155 between nodes NO1 and NO2, which depends on the number of transistors P20 in circuit 120, the distance between gates of two transistors P20 in the chain of transistors P20-1 to P20-M, the RC constant of the line between two transistors P20, etc. In some embodiments, a value of time delay T55 is adjusted by adjusting a combination of a value of time delay T20, a value of ratio RAT, and/or a number of transistors P20 in circuit 120. A value of time delay T20 is adjusted by adjusting the RC constant value of resistor R20 and capacitor C20. In some embodiments, the RC constant value of resistor R20 and capacitor C20 depends on a thickness of the line segment between two gates of two transistors P20. In some embodiments, based on a fixed number of transistors P20, such as M transistors P20-1 to P20-M, in circuit 120, after a value of time delay T20 is selected, a predetermined value of time delay T55 is obtained by varying a value of ratio RAT. For another example, after a ratio RAT is selected, a predetermined value of time delay T55 is obtained by adjusting a value of time delay T20. Obtaining a predetermined value of time delay T55 is used to obtain a time delay TDLY explained below with reference to FIG. 3.

Because of the time delay T20 between two gates of two transistors P20, a second transistor P20 succeeding a first transistor P20 in the chain of transistors P20-1 to P20-M is turned on a time delay T20 after the first transistor P20 is turned on. For example, transistor P20-2 is turned on a time delay T20 after transistor P20-1 is turned on. Transistor P20-3 is turned on a time delay T20 after transistor P20-2 is turned on, etc. Transistor P20-M is then turned on last in the chain of transistors P20-1 to P20-M.

For illustration, a voltage drop across a source and a drain of a transistor P20 is called a voltage VSD20 (not labeled). For example, a voltage drop across a source and a drain of transistor P20-1 is called VSD20-1, and a voltage drop across a source and a drain of transistor P20-M is called VSD20-M. A current flowing through a source and a drain of a transistor P20 is called a current ISD20 (not labeled). A voltage drop across node VDDM and node VDDI is called voltage VDMMI.

A circuit or a transistor bank 130 includes a plurality of PMOS transistors P30, labeled as transistors P30-1 to P30-M. Sources of PMOS transistors P30-1 to P30-M are coupled together and receive supply voltage VDD on line VDDM. Drains of PMOS transistors P30-1 to P30-M are coupled together and provide supply voltage VDD from line VDDM to line VDDI. Gates of PMOS transistors P30-1 to P30-M are coupled together and receive a signal SD_ARRAY. When signal SD_ARRAY is logically low, transistors P30-1 to P30M are turned on, and supply voltage VDD at sources of transistors P30-1 to P30-M is transferred to drains of corresponding transistors P30-1 to P30-M. Effectively, supply voltage VDD on line VDDM is transferred to line VDDI. In some embodiments, line VDDM that couples the sources of transistors P30-1 to P30-M is coupled with line VDDM that couples the sources of transistors P20-1 to P20-M in a grid structure. In some embodiments, during a wakeup mode, circuit 130 is turned on after circuit 120 is turned on. For example, after the last transistor P20-M in the chain of transistors P20-1 to P20-M is turned on, transistors P30-1 to P30-M are turned on in the sequence of transistors P30-1, P30-2, ..., P30-M.

In some embodiments, each transistor P30-1 to P30-M in circuit 130 corresponds to a transistor P20-1 to P20-M in circuit 120. Effectively, each transistor P30-1 to P30-M also corresponds to a local input-output (LIO) and a column COL-1, COL-2, or COL-M of the memory macro 800 having the LIOs. In some embodiments, each transistor P30-1 to P30-M is sized such that each transistor P30-1 to P30-M provides sufficient current and voltage VDD to the drain of corresponding transistor P30-1 to P30-M to run a particular application, a circuit, a device, etc. For example, when circuit 100 is used in a memory macro 800, each of transistors P30-1 to P30-M is sized such that transistor P30-1 to P30-M provide sufficient current and voltage to perform a read or a write operation of the memory macro 800.

A node NO3 represents a point at a gate of the first transistor P30-1 in the chain of transistors P30-1 to P30-M of circuit 130.

For illustration, a voltage drop across a source and a drain of a transistor P30 is called a voltage VSD30 (not labeled). For example, a voltage drop across a source and a drain of transistor P30-1 is called VSD30-1, and a voltage drop across a source and a drain of transistor P30-M is called VSD30-M. A current flowing through a source and a drain of a transistor P30 is called a current ISD30 (not labeled). When currents ISD20 of transistors P20-1 to P20-N and currents ISD30 of transistors P30-1 to P30-N start flowing at about the same time, a current spike occurs, resulting in a peak current. In some embodiments, the turn-on of circuits 120 and 130 is controlled to reduce the wakeup peak current of circuit 100 and of circuits that use circuit 100.

A circuit 110 is used to control the turn-on and turn-off of circuits 120 and 130. For illustration, when circuit 100 enters the wakeup mode, signal SD at an input of an inverter 112 transitions from a high to a low logical value. By operations of inverters 112 and 114, a signal SD_LS at an output of inverter 114 also transitions from a high to a low logical value. Because signal SD_LS is also at gates of transistors P20-1 to P20-M in circuit 120, PMOS transistors P20-1 to P20-M in circuit 120 are turned on.

In some embodiments, a signal SD_DEL is signal SD_LS delayed by time delay T55. As a result, signal SD_DEL also transitions from a high to a low logical value after time delay T55. Because signal SD_LS and signal SD_DEL transition from a high to a low logical value, by operation of a NOR gate 115 and inverters 116 and 118, signal SD_ARRAY also transitions from a high to a low logical value, subject to a time delay as explained below. Consequently, PMOS transistors P30-1 to P30-M in circuit 130 are also turned on. Effectively, circuit 130 is turned on after circuit 120 by a time delay as explained below.

Time Delays

A time delay TDLY includes a time delay for signal SD to travel through inverters 112, 114 to node NO1, through transistors P20-1 to P20-M to node NO2, a delay circuit 140, OR gate 115, inverter 116, and inverter 118 to node NO3. Time delay T55 of line 155 between node NO1 and node NO2 is explained above.

Delay circuit 140 provides an adjustable time delay T40 (not labeled). In some embodiments, circuit 140 includes a resistor R10 and a capacitor C10 to result in a time delay T40. In some embodiments, resistor R10 is adjustable, capacitor C10 is adjustable, and time delay T40 is adjustable by tuning the resistance of resistor R10 and/or tuning the capacitance of capacitor C10. Different ways for circuit 140 to provide adjustable time delay T40 are within the contemplated scope of the present disclosure. For example, circuit 140 includes a plurality of pairs of resistors and capacitors that can be switched onto line 115 to increase the time delay and switched out of line 115 to decrease the time delay, etc. Circuit 140 shown between node NO2 and OR gate 115 is for illustration. Other locations of circuit 140 to cause a delay between node NO2 and node NO3 are within the contemplated scope of the present disclosure. For example, circuit 140 is in between inverter 118 and node NO3. In some embodiments, if time delay T40 is zero, circuit 140 is not included in circuit 100.

Each of OR gate 115, inverter 116, and inverter 118 has a corresponding time delay. For simplicity, the time delay through OR gate 115, inverter 116, and inverter 118 is considered the same, and is called a gate time delay TGATE. A time delay between circuit 140 and node NO3 depends on the number of logic gates between circuit 140 and node NO3. As a result, additional gates are added between inverter 118 and node NO3 to increase time delay TDLY, for example. For another example, at least one pair of inverters is coupled in series, and is coupled between inverter 118 and node NO3 to increase the time delay for time delay TDLY.

Effectively, time delay TDLY includes time delays T55, T40, and corresponding time delays TGATEs of logic gates between circuit 140 and node NO3.

Time Delay and Wakeup Peak Current

As indicated above, the drains of transistors P20-1 to P20-M and P30-1 to P30-M are coupled together. In some embodiments, when circuit 100 is in a shutdown mode, the drains of transistors P20-1 to P20-M and P30-1 to P30-M are at a voltage VDSD (not labeled), for example. Without leakage currents of transistors P20-1 to P20-M and/or other circuits that use circuit 100, voltage VDSD is about a reference voltage VSS, which is some embodiments, is ground. Because of the leakage currents, however, voltage VDSD at the drains of transistors P20-1 to P20-M and P30-1 to P30-M is pulled away from voltage VSS a voltage amount depending on the leakage current. For illustration, the drains of transistors P20-1 to P20-M and P30-1 to P30-M are considered to be at voltage VSS.

In some embodiments, when voltage VSD30 dropped across a source and a drain of a transistor P30 increases, corresponding current ISD30 of the same transistor P30 increases. In contrast, when voltage VSD30 decreases, the corresponding current ISD30 decreases. In some embodiments, voltages VSD30 of transistors P30-1 to P30-M are decreased so that corresponding currents IDS30 of the corresponding transistors are decreased. For example, voltage VSD30 of a transistor P30 is decreased by raising a voltage at a drain of corresponding transistor P30. For another example, after transistor P20-1 in circuit 120 is turned on, the drain of transistor P20-1 instantly has voltage VDD from the source of transistor P20-1. Transistors P20-2, P20-3, . . . , P20-M and transistors P30-1, P30-2, . . . , P30-M are then each turned on sequentially. When some transistors in the chain of transistors P20-1 to P20-M and P30-1 to P30-M are turned on, the voltage at the drains of the transistors that are turned on instantly have voltage VDD from the corresponding sources of the turned-on transistors. The voltage VDD of the transistors that have been turned on propagates to the drains of transistors that have not been turned on. As a result, the voltage at the drains of transistors in the chain of transistors P20-1 to P20-M and transistors P30-1 to P30-M that have not been turned on is raised to be higher than voltage VSS. Effectively, voltage VSD dropped across the sources and the drains of transistors that have a raised voltage at the drain decreases. Similarly, currents ISD flowing through the sources and the drains of transistors that have a raised voltage at the drain also decreases.

In some embodiments, time delay TDLY is selected at a predetermined delay value such that when the low voltage value of signal SD_ARRAY reaches the gate of transistor P30-1 to turn on transistors P30-1 to P30-M, the peak current of circuit 100 is less than a predetermined current value. Explained in a different way, during the wakeup mode while transistors P30-1 to P30-M are being turned on, the wakeup peak current is less than the predetermined current value, and is therefore compliant with a design specification for a particular application. Effectively, in circuit 100, transistors P20-1 to P20-M and P30-1 to P30-M are turned on such that the wakeup peak current is less than the predetermined current value.

Methods

Figure 2:
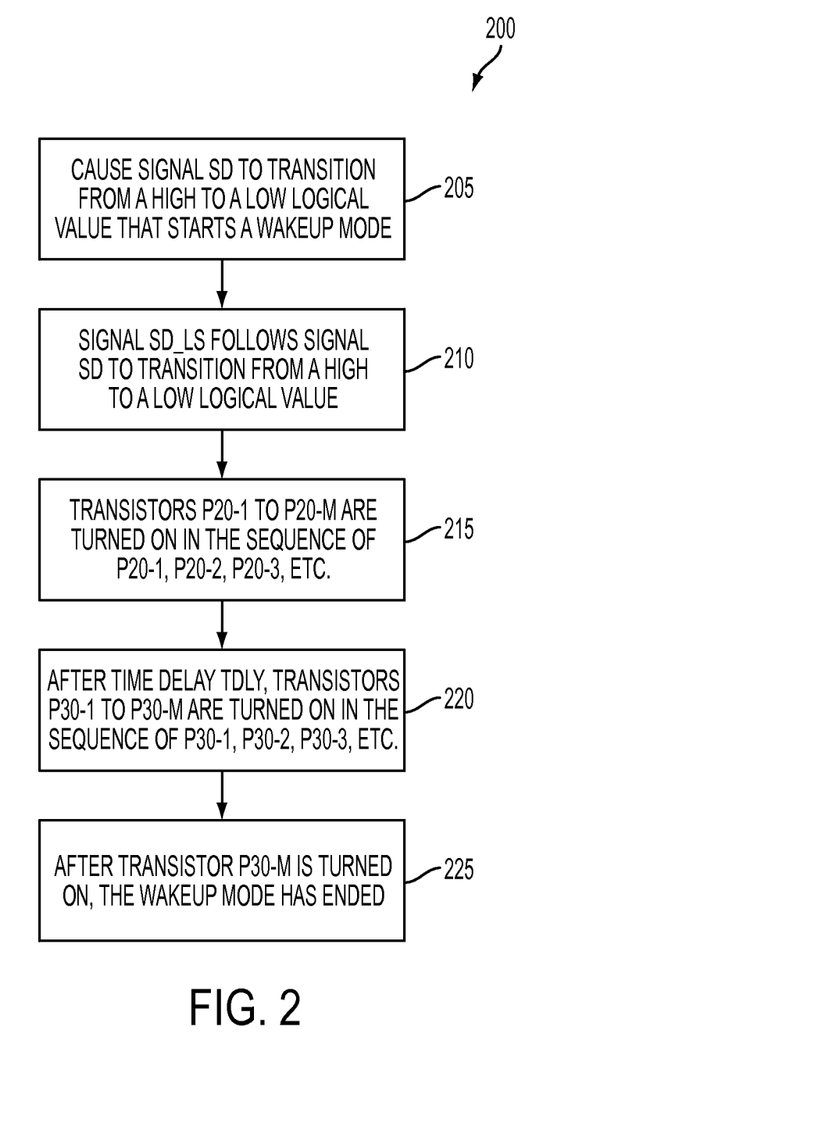
FIG. 2 is a flowchart of a method of operating the circuit in FIG. 1, in accordance with some embodiments.

FIG. 2 is a flowchart 200, in accordance with some embodiments. Flowchart 200 illustrates an operation of circuit 100 in FIG. 1 for a wakeup peak current to comply with a design specification.

In operation 205, signal SD in FIG. 1 is caused to transition from a high to a low logical value. In some embodiments, in such a condition, circuit 100 is out of a shutdown mode and enters a wakeup or power-up mode.

In operation 210, by operation of inverters 112 and 114, signal SD_LS follows signal SD to transition from a high to a low logical value.

In operation 215, transistors P20-1 to P20-M are turned on in the sequence of transistors P20-1, P20-2, P20-3, etc. In some embodiments, during the time transistors P20-1 to P20-M are being turned on, the peak current of circuit 100 is less than a predetermined value.

As more transistors P20 in the chain of transistors P20-1 to P20-M are turned on in combination with the elapse of time, the voltage at the drains of transistors in the chain of transistors P20-1 to P20-M and P30-1 to P30-M that have not been turned on is raised above reference voltage VSS.

In operation 220, after a time delay TDLY from the time signal SD transitions to a low logical value, signal SD_ARRAY at node NO3 also transitions from a high to a low logical value. As a result, transistors P30-1 to P30-M are turned on in the sequence of transistors P30-1, P30-2, P30-3, etc.

In operation 225, after transistor P30-M is turned on, the drains of all transistors P30-1 to P30-M have a supply voltage VDD. By the time transistor P30-M is turned on, the wakeup mode has ended. As a result, supply voltage VDD on line VDDI is ready for use by other circuits that use circuit 100 as a wakeup circuit.

After operation 220 above, by the time transistor P30-1 is turned on, a time delay TDLY from the time signal SD transition to a low logical value has elapsed. Further, the voltage at the drains of various transistors P30-1 to P30-M that have not been turned on has been raised above reference voltage VSS. As a result, voltage VSD30 dropped across the sources and the drains of transistors P30-1 to P30-M that have not been turned on has decreased. Corresponding currents ISD30 also decreases. Effectively, currents ISD30 of transistors P30-1 to P30-M decreases, and the peak current of circuit 100 decreases, compared with the situation when the voltage at the drains of the transistors P30 that have not been turned on stays at reference voltage VSS. In some embodiments, time delay TDLY is configured such that the wakeup peak current is lower than a predetermined value to comply with a design specification that specifies a maximum wakeup peak current. Further, the wakeup time that includes the time when signal SD transitions from a high to a low logical value to the time the voltage on line VDDI is ready for use by other circuits is faster than a wakeup time of other approaches. As a result, various embodiments of the present disclosure are advantageous over other approaches. Explained in a different way, in other approaches, for the wakeup time to comply with the design specification, a wakeup time in the other approaches is longer that the wakeup time of the present disclosure.

Figure 3:
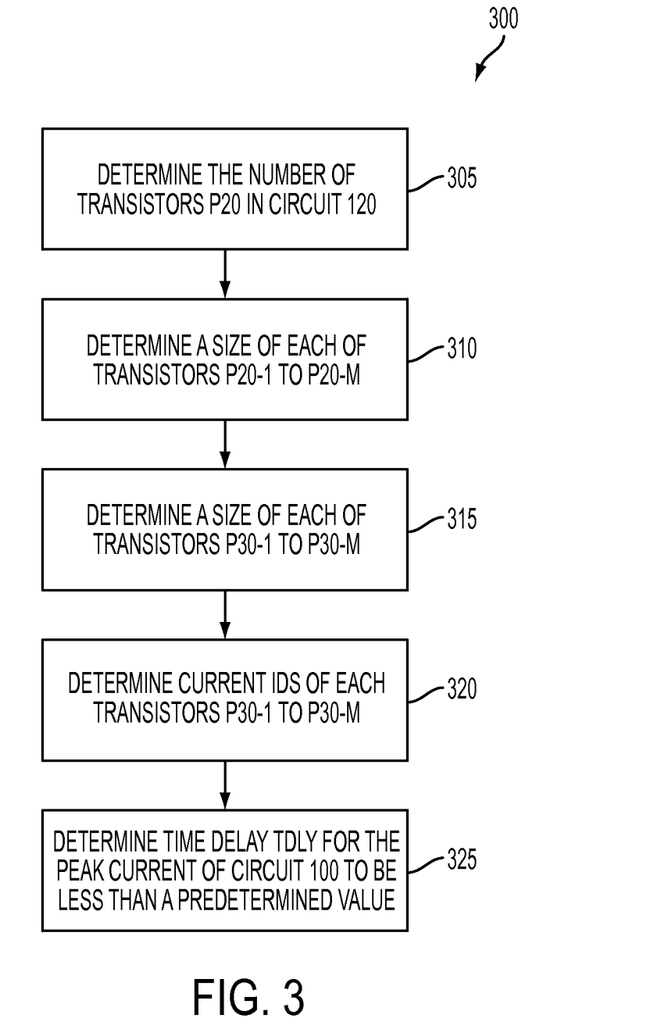
FIG. 3 is a flowchart of a method of determining a time delay for use in the circuit of FIG. 1, in accordance with some embodiments.

FIG. 3 is a flowchart of a method 300, in accordance with some embodiments. Method 300 illustrates operations to determine time delay TDLY for a wakeup peak current to comply with a design specification specifying a maximum wakeup peak current. The wakeup peak current in the illustration of FIG. 3 is with reference to supply voltage VDD.

In operation 305, the number of transistors P-20 in circuit 120 is determined. In some embodiments, M number of transistors P20 is selected wherein M is the number of columns of a memory array in a memory macro. Other values of M are within the contemplated scope of the present disclosure.

In operation 310, a size of each of transistors P20-1 to P20-M is determined. In some embodiments, the size of each of transistors P20-1 to P20-M is determined such that when transistors P20-1 to P20-M are turned on in the sequence of transistors P20-1, P20-2, P20-3, etc., the peak current of circuit 100 is less than a predetermined value. In some embodiments, operation 310 is performed in conjunction with operation 305, such that the peak current of circuit 100 is less than the predetermined value. For example, the number of transistors P20 and/or the size of each transistor P20 are selected so that the peak current is less than the predetermined value. For another example, the number of transistors P20 is selected to be different from the number of columns of the memory array of the memory macro that uses circuit 100 as a wakeup circuit.

In some embodiments, the number of transistors P20 and/or the size of each of transistors P20-1 to P20-M are determined based on simulation. In some embodiments, the size of each of transistors P20-1 to P20-M is the same as that of another transistor P20. Transistors P20 having different sizes are within the contemplated scope of the present disclosure.

In operation 315, a size of each of transistors P30-1 to P30-M is determined. In some embodiments, the size of each transistor P30-1 to P30-M is determined such that each of transistors P30-1 to P30-M sufficiently provides voltage VDD and current ISD30 to run a particular application. For example, voltage VDD and current ISD30 each satisfy a predetermined value. In some embodiments, a size of each of transistors P30-1 to P30-M is the same as that of another transistor P30. Transistors P30 having different sizes are within the contemplated scope of the present disclosure. In various embodiments, the size of each of transistors P30-1 to P30-M is determined independent of a specified maximum wakeup peak current.

In operation 320, based on the size of each of transistors P30-1 to P30-M, a current ISD30 of each of transistors P30-1 to P30-M is determined.

In operation 325, time delay TDLY is determined. In some embodiments, based on simulation, time delay TDLY is determined such that when transistors P30-1 to P30-M are being turned on, the peak current of circuit 100 is less than a predetermined value specified as a maximum wakeup peak current. For example, if the peak current is to increase, time delay TDLY is decreased. But if the peak current is to decrease, time delay TDLY is increased. Time delay TDLY is adjusted by adjusting one or a combination of time delay T55, and time delay T40, and/or selecting different numbers of logic gates between inverter 118 and node NO3. For illustration, a time delay T40 is selected. The number of logic gates between inverter 118 and node NO2 is also selected. Time delay T55 is then adjusted as explained above, to adjust time delay TDLY.

Other Power Management Mechanisms

Figure 4:
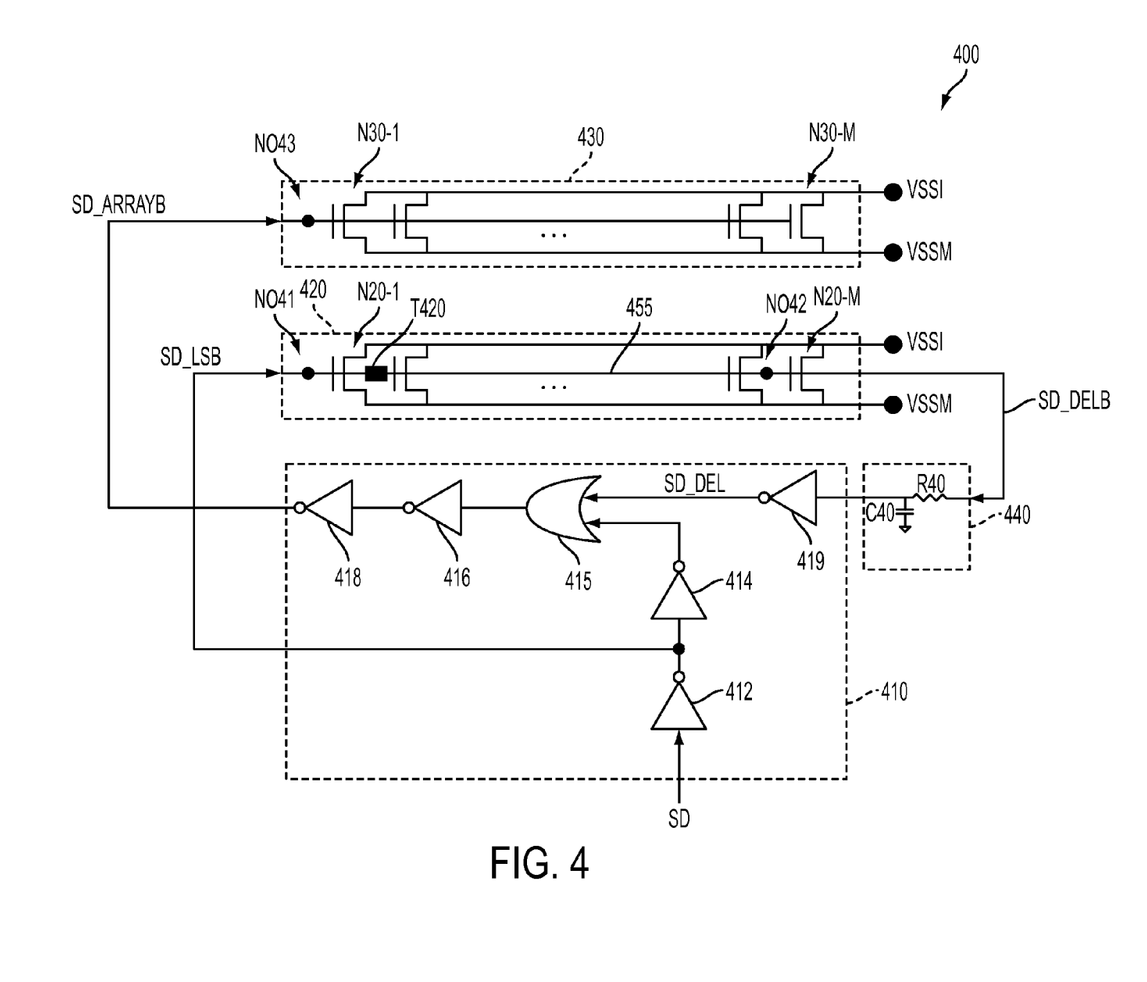
FIG. 4 is a diagram of another wakeup power-management circuit, in accordance with some embodiments.

FIG. 4 is a diagram of a circuit 400, in accordance with some embodiments. Circuit 400 is a wakeup power-management circuit. For example, during a wakeup mode, the peak current of circuit 400 is designed to below a predetermined value specified as a maximum reference wakeup peak current. At the end of the wakeup mode, circuit 400 provides reference supply voltage VSS (not labeled) on a line VSSM to a line VSSI for use by other circuits that use circuit 400.

In some embodiments, memory macro 800 depicted in FIG. 8 is usable in conjunction with the circuit 400 depicted in FIG. 4 in accordance with some embodiments. In some embodiments, node 810 is coupled with supply voltage VDD, and node 820 is coupled with line VSSI in FIG. 4.

In some embodiments, when circuit 400 is in the shutdown mode, the drains of transistors N20-1 to N20-M and N30-1 to N30-M are at a voltage value VSSD (not labeled), for example. The voltage value VSSD varies depending on leakage currents of transistors N20-1 to N20-M and/or other circuits that use circuit 100. In some embodiments, voltage value VSSD is about half of supply voltage VDD. Other voltage values of VSSD are within the contemplated scope of the present disclosure.

Compared with circuit 100, in circuit 400, circuits 410, 420, 430, and 440, correspond to circuits 110, 120, 130, and 140, respectively. Nodes NO41, NO42, and NO43 correspond to nodes NO1, NO2, and NO3, respectively. Signals SD_LSB, SD_DELB, SD_ARRAYB corresponds to signals SD_LS, SD_DEL, and SD_ARRAY, respectively.

In circuit 410, inverters 412, 414, 416, 418 and OR gate 415 correspond to inverters 112, 114, 116, 118 and OR gate 115, respectively. An inverter 419 is added to invert signal SD_DELB to signal SD_DEL.

In circuit 420, transistors N20-1 to N20-M are NMOS transistors, however, and are collectively referred to as transistors N20. Effectively, NMOS transistors N20-1 to N20-M correspond to PMOS transistors P20-1 to P20-M, respectively. A line 455 corresponds to line 155. A time delay T420 corresponds to time delay T20. A line VSSM corresponds to line VDDM. A line VSSI corresponds to line VDDI.

Compared In circuit 430, transistors N30-1 to N30-M are also NMOS transistors, and are collectively referred to as transistors N30. Effectively, NMOS transistors N30-1 to N30-M correspond to PMOS transistors P30-1 to P30-M.

In circuit 440, a resistor R40 and a capacitor C40 correspond to resistor R10 and capacitor C10, respectively.

Figure 5:
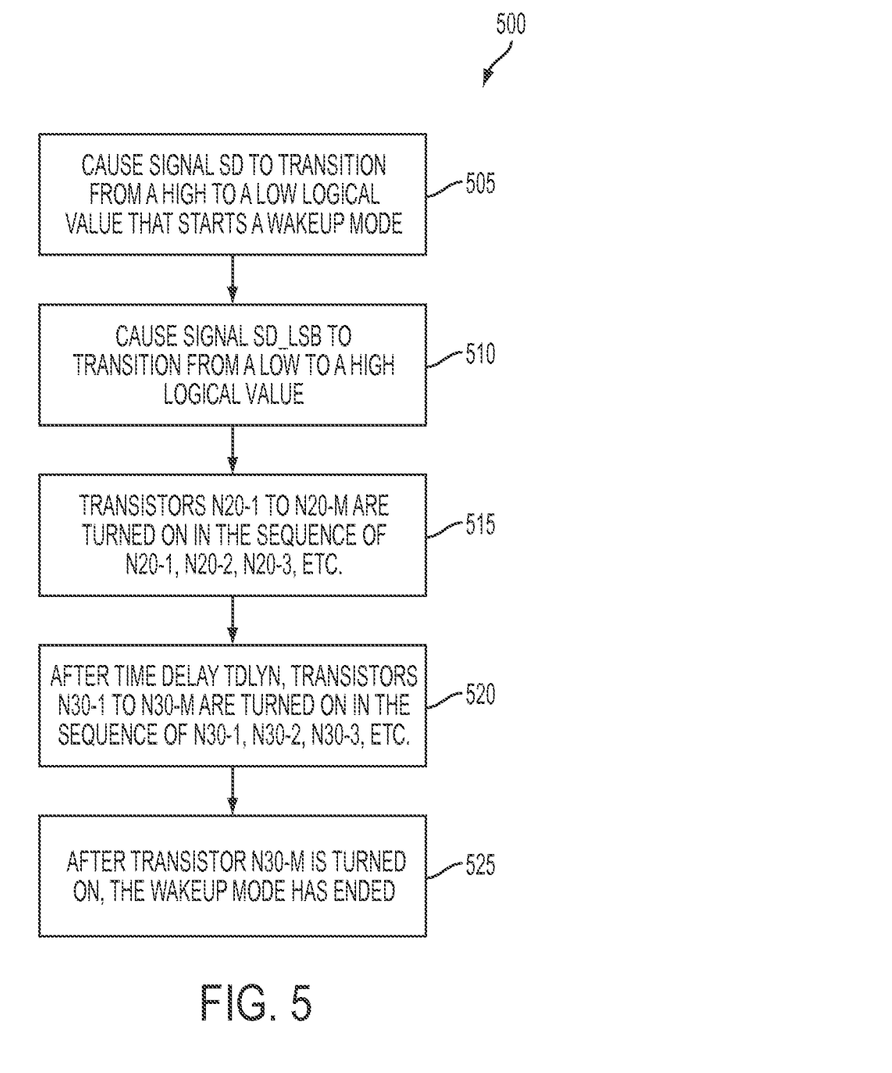
FIG. 5 is a flowchart of a method of operating the circuit in FIG. 4, in accordance with some embodiments.

FIG. 5 is a flowchart 500, in accordance with some embodiments. Flowchart 500 illustrates an operation of circuit 400 in FIG. 4 for a wakeup reference current to comply with a design specification.

In operation 505, signal SD in FIG. 4 transitions from a high to a low logical value. In some embodiments, in such a condition, circuit 400 is out of a shutdown mode and enters a wakeup or power-up mode.

In operation 510, by operation of inverter 412, signal SD_LSB is an inverse of signal SD and transitions from a low to a high logical value.

In operation 515, transistors N20-1 to N20-M are turned on in the sequence of transistors N20-1, N20-2, N20-3, etc. In some embodiments, during the time transistors N20-1 to N20-M are being turned on, the peak current of circuit 400 is less than a predetermined value.

As more transistors N20 in the chain of transistors N20-1 to N20-M are turned on in combination with the elapse of time, the voltage at the drains of transistors in the chain of transistors N20-1 to N20-M and N30-1 to N30-M that have not been turned on is lowered below voltage value VSSSD.

In operation 520, after a time delay TDLYN from the time signal SD transitions from a high to a low logical value, signal SD_ARRAYB at node NO43 also transitions from a low to a high logical value. As a result, transistors N30-1 to N30-M are turned on in the sequence of transistors N30-1, N30-2, N30-3, etc.

In operation 525, after transistor N30-M is turned on, the drains of all transistors N30-1 to N30-M have a reference supply voltage VSS from the sources of transistors N30-1 to N30-M coupled with line VSSM. In other words, circuit 400 has completed the wakeup mode. Reference supply voltage VSS is therefore ready for used by other circuits that use circuit 400 as a wakeup circuit.

After operation 520 above, by the time transistor N30-1 is turned on, a time delay TDLYN from the time signal SD transitions to a high logical value has elapsed. Further, the voltage at the drains of various transistors N30-1 to N30-M that have not been turned on has been lowered below voltage value VSSD. As a result, a voltage VDS30N (not labeled) dropped across the drains and the sources of transistors N30-1 to N30-M that have not been turned on has decreased. Corresponding currents IDS30N also decreases. Effectively, currents IDS30N of transistors N30-1 to N30-M decreases, and the wakeup peak current of circuit 400 decreases, compared with the situation when the voltage at the drains of the transistors that have not been turned on stays at voltage level VSSD. In some embodiments, time delay TDLYN is configured such the wakeup peak current is lower than a predetermined value to comply with a design specification that specifies a maximum wakeup peak current with reference to reference supply voltage VSS. Further, the wakeup time that includes the time when signal SD transitions from a high to a low logical value to the time transistor N30-M is turned on is faster than a wakeup time of other approaches. As a result, various embodiments of the present disclosure are advantageous over other approaches. Explained in a different way, in other approaches, for the wakeup peak current to comply with the design specification, the wakeup time in those approaches is longer than the wakeup time of the present disclosure.

Figure 6:
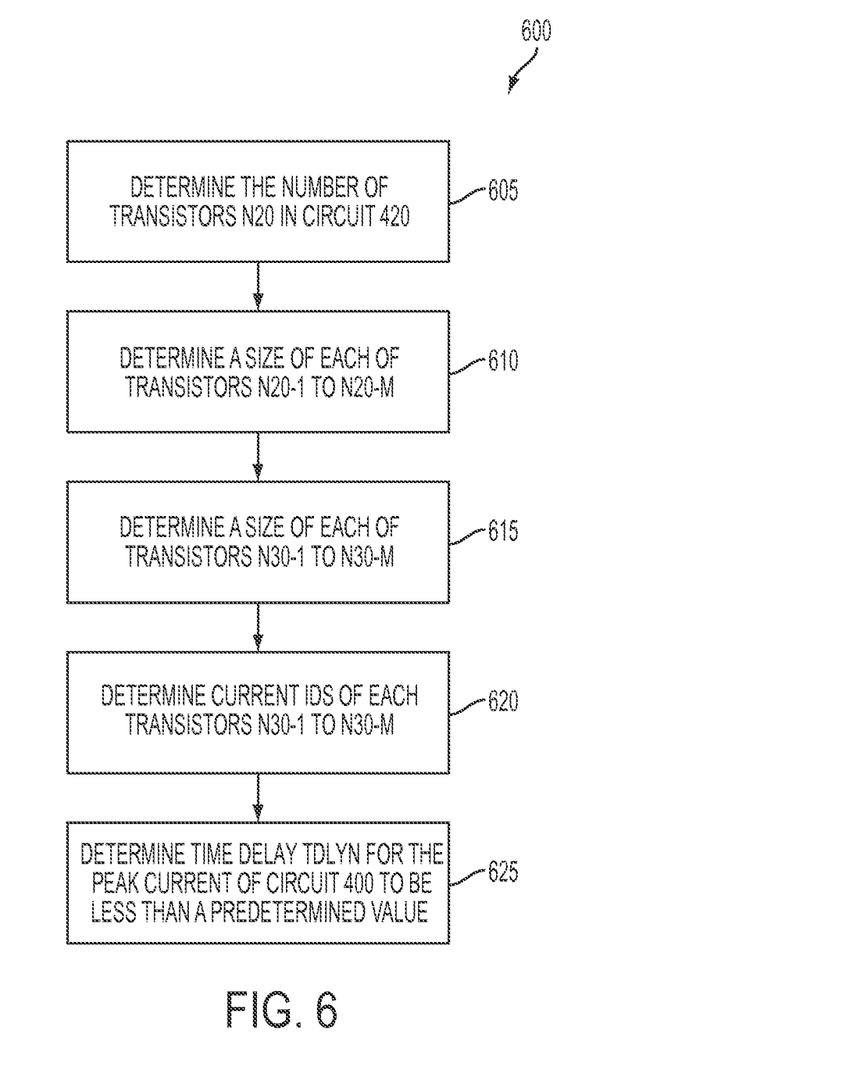
FIG. 6 is a flowchart of a method of determining a time delay for use in the circuit of FIG. 4, in accordance with some embodiments.

FIG. 6 is a flowchart of a method 600, in accordance with some embodiments. Method 600 illustrates operations to determine time delay TDLYN for a wakeup peak current to comply with a design specification specifying a maximum wakeup peak current with reference to reference supply voltage VSS.

In operation 605, the number of transistors N20 in circuit 420 is determined. In some embodiments, M number of transistors N20 is selected wherein M is the number of columns of a memory array in a memory macro. Other values of M are within the contemplated scope of the present disclosure.

In operation 610, a size of each of transistors N20-1 to N20-M is determined. In some embodiments, the size of each of transistors N20-1 to N20-M is determined such that when transistors N20-1 to N20-M are turned on in the sequence of transistors N20-1, N20-2, N20-3, etc., the peak current of circuit 400 is less than a predetermined value. In some embodiments, operation 610 is performed in conjunction with operation 605, such that the peak current of circuit 400 is less than the predetermined value. For example, the number of transistors N20 and/or the size of each transistor N20 are selected so that the peak current is less than the predetermined value. For another example, the number of transistors N20 is selected to be different from the number of columns of the memory array of the memory macro that uses circuit 400 as a wakeup circuit.

In some embodiments, the number of transistors N20 and/or the size of each of transistors N20-1 to N20-N are determined based on simulation. In some embodiments, the size of each of transistors N20-1 to N20-M is the same as that of another transistor N20. Transistors N20 having different sizes are within the contemplated scope of the present disclosure.

In operation 615, a size of each of transistors N30-1 to N30-M is determined. In some embodiments, the size of each transistor N30-1 to N30-M is determined such that each of transistors N30-1 to N30-M sufficiently provides reference voltage VSS and current ISD30N to run a particular application. For example, voltage VSS and current ISD30N each satisfy a predetermined value. In some embodiments, sizes of transistors N30-1 to N30-M are each the same. Transistors N30-1 to N30-M having different sizes are within the contemplated scope of the present disclosure. In various embodiments, the size of each of transistors N30-1 to N30-M is determined independent of a specified maximum wakeup peak current with reference to reference supply voltage VSS.

In operation 620, based on the size of each of transistors N30-1 to N30-M, a current ISD30N of each of transistors N30-1 to N30-M is determined.

In operation 625, time delay TDLYN is determined. In some embodiments, based on simulation, time delay TDLYN is determined such that when transistors N30-1 to N30-M are being turned on, the peak current of circuit 400 is less than a predetermined value specified as a maximum wakeup peak current with reference to reference supply voltage VSS. For example, if the peak current is to increase, time delay TDLYN is decreased. But if the peak current is to decrease, time delay TDLYN is increased. Time delay TDLYN is adjusted by adjusting one or a combination of time delay T455, and time delay T420, and/or determining the number of logic gates between inverter 418 and node NO43. For illustration, a time delay T440 is selected. The number of logic gates between inverter 418 and node NO43 is also selected. Time delay T455 is then adjusted as explained above, to adjust time delay TDLYN.

Figure 7:
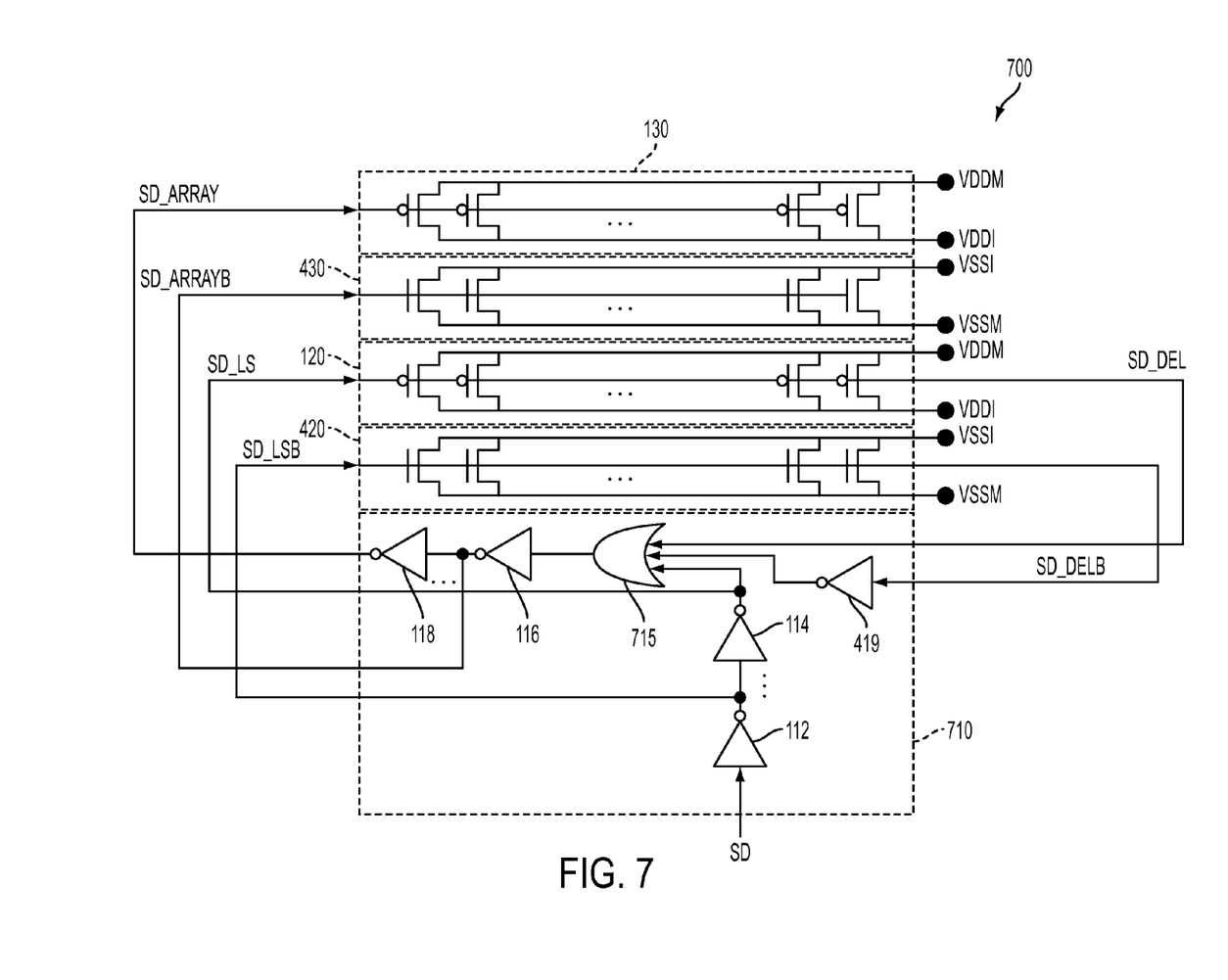
FIG. 7 is a diagram of a wakeup power-management circuit that includes features similar to those in the circuits in FIGS. 1 and 4, in accordance with some embodiments.

FIG. 7 is a diagram of a wakeup power-management circuit 700, in accordance with some embodiments. Circuit 700 includes features of circuit 100 in FIG. 1 and circuit 400 in FIG. 4. As a result, circuit 700 includes circuit elements similar to those of circuits 100 and 400 and other circuits to implement a combination of circuits 100 and 400 in circuit 700. For simplicity, various elements of circuits 100 and 400 are not shown, nor labeled. For example, time delay 140 in FIG. 1 and time delay 440 are not shown in FIG. 7. A circuit 710 includes circuit elements of circuit 110 in FIG. 1 and circuit 410 in FIG. 4, and functions for circuits 100 and 400 to operate together.

For example, circuit 700 includes transistor banks 120 and 130 of circuit 100 and transistor banks 420 and 430 of circuit 400. A circuit 710 includes inverters 112, 114, 116, 118 of FIG. 1, and includes inverter 419 of FIG. 4. OR-gate 715 is used in place of OR-gate 115 and 415.

In some embodiments, memory macro 800 depicted in FIG. 8 is usable in conjunction with the circuit 700 depicted in FIG. 7 in accordance with some embodiments. In some embodiments, node 810 is coupled with line VDDI in FIG. 7, and node 820 is coupled with line VSSI in FIG. 7.

In some embodiments, a circuit comprises a first set of first transistors and a second set of transistors. The first transistors are turned on in a sequential manner. The second transistors are turned on in a sequential manner after the first transistors are turned on. A transistor of the first set of first transistors corresponds to a first time delay. The first set of first transistors corresponds to a second time delay that is a multiple of the first time delay.

Some embodiments regard a method. In the method, transistors in a first set of transistors are turned on in a sequential manner, then transistors in a second set of transistors are turned in a sequential manner. A wakeup current value of a circuit using the first set of transistors and the second set of transistors is less than a predetermined value during turning on the transistors in the first set of transistors or during turning on the transistors in the second set of transistors. A delay time corresponding to the first set of transistors is related to a number of columns in an array of memory cells by a ratio that is mathematically a real number.

Some embodiments regard a method. In the method, one or a combination of a size of transistors in the first set of transistors and a number of transistors in the first set of transistor is adjusted such that a current flowing through the transistors in the first set of transistors is less than a predetermined value. A time delay is determined to turn on transistors in a second set of transistors after turning on a first transistor in the first set of transistors such that a current flowing through the transistors in the first set of transistors and the transistors in the second set of transistors is less than the predetermined value. The time delay is related to a number of columns of a memory array by a number that is mathematically a real number.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first set of transistors, each transistor of the first set of transistors comprising a gate configured to receive a first control signal, the first set of transistors thereby being configured to be turned on in a sequential manner responsive to the first control signal and to output a first delayed signal;
a control circuit comprising a first input configured to receive the first control signal and a second input configured to receive the first delayed signal, and to generate a second control signal; and
a second set of transistors, each transistor of the second set of transistors comprising a gate configured to receive the second control signal, the second set of transistors thereby being configured to be turned on in a sequential manner responsive to the second control signal after the first set of transistors is turned on,
wherein
a transistor of the first set of transistors corresponds to a first time delay;
the first set of transistors corresponds to a second time delay that is a multiple of the first time delay; and
the first delayed signal corresponds to delaying the first control signal by at least the second time delay.

2. The circuit of claim 1, wherein
a size of the transistor of the first set of transistors is different from a size of a transistor of the second set of transistors.

3. The circuit of claim 1, wherein
a size of the transistor of the first set of transistors is smaller than a size of a transistor of the second set of transistors.

4. The circuit of claim 1, wherein
a number of the first set of transistors equals a number of the second set of transistors and a number of columns of a memory array, the memory array being electrically coupled with the first set of transistors and the second set of transistors.

5. The circuit of claim 1, wherein
the second time delay is proportional to a number of columns of a memory array by a ratio, the ratio being a mathematical real number, and the memory array being electrically coupled with the first set of transistors and the second set of transistors.

6. The circuit of claim 1, wherein
the transistor of the first set of transistors and a transistor of the second set of transistors are configured to provide a same voltage.

7. The circuit of claim 6, wherein
the voltage is either a supply voltage or a reference supply voltage.

8. The circuit of claim 1, wherein
the first set of transistors and the second set of transistors are PMOS transistors.

9. The circuit of claim 1, wherein
the first set of transistors and the second set of transistors are NMOS transistors.

10. The circuit of claim 1, wherein the control circuit comprises:
a delay circuit configured to receive the first delayed signal and output a second delayed signal, the second delay signal corresponding to delaying the first delayed by at least a third time delay; and
a logic circuit configured to generate the second control signal based on the first control signal and the second delay signal.

11. A method comprising:
turning on transistors in a first set of transistors in a sequential manner responsive to a first control signal;
delaying the first control signal by the first set of transistors, thereby outputting a first delayed signal;
generating a second control signal by a control circuit based on the first control signal and the first delayed signal, the first control signal and the first delayed signal being both received by the control circuit; and
turning on transistors in a second set of transistors in a sequential manner responsive to the second control signal,
wherein
a wakeup current value of a circuit using the first set of transistors and the second set of transistors is less than a predetermined value during turning on the transistors in the first set of transistors or during turning on the transistors in the second set of transistors; and
a delay time corresponding to the first set of transistors is related to a number of columns in an array of memory cells by a ratio that is mathematically a real number.

12. The method of claim 11, wherein generating the second control signal by the control circuit comprises:
generating a second delayed signal by delaying the first delayed signal; and
generating the second control signal based on the first control signal and the second delayed signal.

13. The method of claim 11, wherein
a size of a transistor in the first set of transistors is smaller than a size of a transistor in the second set of transistors.

14. The method of claim 11, wherein
a transistor in the first set of transistors and a transistor in the second set of transistors are configured to provide a same voltage.

15. The method of claim 11, wherein
gates of the transistors in the first set of transistors are coupled together.

16. The method of claim 11, wherein
the transistors in the first set of transistors and the transistors in the second set of transistors are of a same type.

17. A method of configuring a circuit, comprising:
adjusting one or a combination of a size of transistors in a first set of transistors of the circuit and a number of the transistors in the first set of transistors such that a peak current of the circuit is less than a predetermined value, the transistors in the first set of transistors are configured to be turned on responsive to a first control signal and to output a delayed first control signal;
determining a first time delay to turn on transistors in a second set of transistors of the circuit after turning on a first transistor in the first set of transistors such that the peak current of the circuit is less than the predetermined value, the transistors in the second set of transistors are configured to be turned on responsive to a second control signal;
wherein
the second control signal is generated by a control circuit based on the first control signal and the delayed first control signal, the first control signal and the delayed first control signal being both received by the control circuit;
the delayed first control signal corresponds to delaying the first control signal by at least a second time delay less than the first time delay; and
the second time delay is related to the number of transistors in the first set of transistors.

18. The method of claim 17, wherein
the number of transistors in the first set of transistors is equal to a number of columns of a memory array, the memory array being electrically coupled with the first set of transistors and the second set of transistors.

19. The method of claim 17, wherein
the transistors in the first set of transistors and the transistors in the second set of transistors are configured to provide a same supply voltage.

20. The method of claim 17, wherein
the transistors in the first set of transistors and the transistors in the second set of transistors are of a same type.

* * * * *